United States Patent [19]

Fiordalice et al.

[11] Patent Number: 5,429,989

[45] Date of Patent: Jul. 4, 1995

[54] PROCESS FOR FABRICATING A METALLIZATION STRUCTURE IN A SEMICONDUCTOR DEVICE

[75] Inventors: Robert W. Fiordalice; Faivel S. Pintchovski, both of Austin, Tex.

[73] Assignee: Motorola, Inc., Schaumburg, Ill.

[21] Appl. No.: 190,966

[22] Filed: Feb. 3, 1994

[51] Int. Cl.⁶ .......................................... H01L 21/44
[52] U.S. Cl. ................................. 437/190; 437/192; 437/203; 437/245
[58] Field of Search ............... 437/192, 245, 246, 203

[56] References Cited

U.S. PATENT DOCUMENTS

| | | | |
|---|---|---|---|
| 4,876,112 | 10/1989 | Kaito et al. | 437/245 |
| 4,926,237 | 5/1990 | Sun et al. | 357/71 |
| 5,019,531 | 5/1991 | Awaya et al. | 437/192 |
| 5,114,750 | 5/1992 | Howard | 427/226 |
| 5,179,042 | 1/1993 | Mikoshiba et al. | 437/192 |
| 5,236,874 | 8/1993 | Pintchovski | 437/245 |
| 5,273,783 | 12/1993 | Wanner | 427/250 |
| 5,300,320 | 4/1994 | Barron et al. | 427/249 |
| 5,354,712 | 10/1994 | Ho et al. | 437/190 |

*Primary Examiner*—Tom Thomas
*Assistant Examiner*—Tuan Nguyen
*Attorney, Agent, or Firm*—Jasper W. Dockrey

[57] ABSTRACT

A process for fabricating a metallization structure includes the formation of an interlayer (20) using an MOCVD deposition process. A metal-organic precursor, having as one component tungsten, is used to deposit the interlayer (20) onto a surface region (18) of a substrate (10) at the bottom of an opening (16). The MOCVD deposition process forms a conformal layer which evenly coats all surfaces of the opening (16). Next, a refractory metal layer (22) is deposited to overlie the interlayer (20). Because of conformal nature of the MOCVD deposition process, refractory metal layer can be formed using corrosive gasses such as tungsten hexafluoride.

15 Claims, 2 Drawing Sheets

PROCESS FOR FABRICATING A METALLIZATION STRUCTURE IN A SEMICONDUCTOR DEVICE

FIELD OF THE INVENTION

This invention relates, in general, to a method for fabricating a semiconductor device, and more particularly, to it method for fabricating metallized contact structures in a semiconductor device.

BACKGROUND OF THE INVENTION

State-of-the-art semiconductor devices are fabricated with reduced feature sizes, and with large numbers of components within a small area of a semiconductor device. Reduced feature size is achieved, in part, by reducing the size of electrical contracts and the junction depth of doped regions within the substrate below the contacts. To fabricate smaller contacts, while maintaining low contact resistance, numerous metal layers are necessary to form the contact structure. The various metal layers are employed to prevent the inter-diffusion of materials present in the metal layers, and to provide adhesion of the metal layers to the underlying substrate.

Historically, metal contacts have been made with aluminum or aluminum alloy metallization. Aluminum, however, presents problems with junction spiking, which results from dissolution of silicon from the substrate and into the aluminum. This problem is exacerbated with small contact sizes because the shallow junction is easily shorted, and because the amount of silicon available to satisfy the solubility requirements of the aluminum is only available through the small contact area. Adding silicon to the aluminum reduces the severity of this problem, but, in turn, has resulted in silicon precipitation and other problems.

Refractory metals have been increasingly employed in high-aspect-ratio contact openings, such as via structures, and the like, to overcome the problems inherent with aluminum metallization. For example, tungsten can be deposited into a contact opening by chemical vapor deposition (CVD). The tungsten is deposited by the reduction of tungsten hexafluoride ($WF_6$) with hydrogen. However, the tungsten hexafluoride initially reacts with the silicon surface consuming silicon from the contact region. This results in the formation of "worm holes" or tunnels in the silicon, which can cause shorting of the underlying junction. The use of other methods for depositing tungsten, such as sputtering, instead of CVD deposited tungsten, overcomes the problem associated with the use of halogenated tungsten; however, sputtered tungsten is non-conformal and therefore cannot be used to form electrical contact structures, such as via plugs and the like.

To avoid the undesirable effects of halogenated tungsten used in the CVD deposition of tungsten metal, other metals, such as titanium nitride and titanium-tungsten, have been used to prevent unwanted reactions between halogenated tungsten and the underlying substrate material. However, materials such as sputter deposited titanium nitride and titanium-tungsten are limited by the inability to deposit these materials in a conformal manner. The conformal deposition of a barrier metal in a high-aspect-ratio via structure is essential to prevent the reaction of halogenated tungsten with the substrate in to the corners of the via structure. Additionally, titanium-tungsten and titanium nitride increase the electrical resistivity of the contact structure. It is especially desirable to avoid the inclusion of any high resistivity metal in a contact structure. To obtain high electrical performance in a semiconductor device, the contact structures must not create an electrical resistivity higher than that of the electrical interconnect leads used to electrically couple the various device components. Accordingly, further development of contact metallization is necessary to provide interlayers and diffusion barrier layers having conformal deposition characteristics, while avoiding an increase in the electrical resistivity of the contact structure.

SUMMARY OF THE INVENTION

In practicing the present invention there is provided a process for fabricating a metallization structure in a semiconductor device in which a metal-organic-chemical-vapor-deposition (MOCVD) process is used to deposit an interlayer prior to depositing a refractory metal layer. The interlayer is deposited using a metal organic source which can be one of a number of different metal coordinate complexes having any number of organic ligands. In one embodiment of the invention, a semiconductor substrate surface is provided. A metal organic precursor, having as one component tungsten, is used to deposit an interlayer onto the semiconductor surface, and a refractory metal layer is deposited onto the interlayer. The deposition of an interlayer from a metal organic precursor can be advantageously carried out at a relatively low deposition temperature and pressure to provide a conformal layer having low electrical resistivity. The conformal deposition of the interlayer improves the electrical performance of the contact metallization by uniformly covering all surfaces of a previously formed contact opening and preventing the attack by halogens on the underlying substrate. Additionally, the low deposition temperature preserves the integrity of doped regions in the underlying substrate by avoiding unwanted thermally induced diffusion of the dopant species in the underlying substrate.

Figure 1:
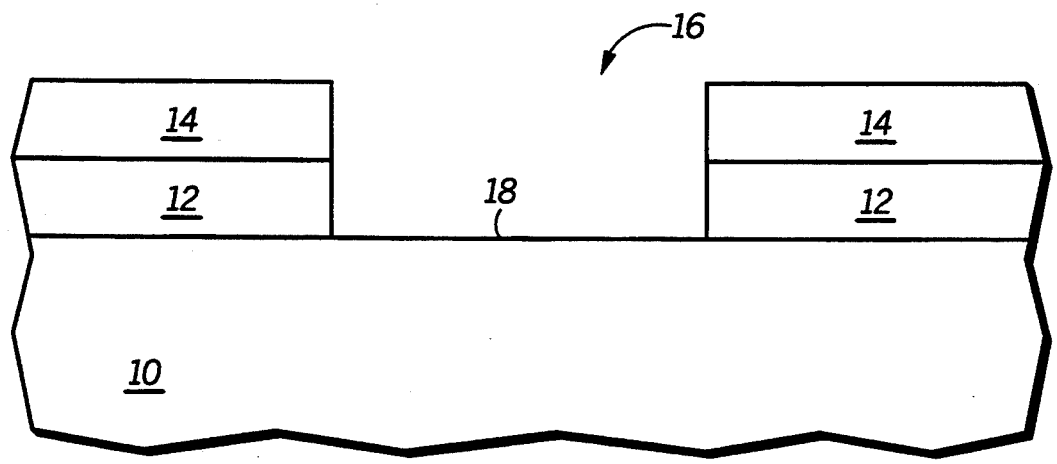
FIGS. 1–4 illustrate, in cross-section, process steps in accordance with one embodiment of the invention.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

The present invention provides a contact metallization in which a metal interlayer is formed by metal-organic-chemical-vapor-deposition (MOCVD). The metal interlayer adheres a refractory metal, such as tungsten, to a substrate having surface regions composed of different materials. The substrate surface regions can be metals, such as aluminum, silicon, refractory metals, refractory metal silicides, and the like, and dielectric materials, such as silicon dioxide and silicon nitride, and the like. The metal interlayer, formed in accordance with the invention, is highly conformal and therefore can be deposited into dense contact structures, such as closely spaced high-aspect ratio via openings, and the like. In one embodiment of the invention, tungsten is deposited from a metal-organic source gas to form a low-resistance, conformal layer in a via contact structure. The via opening is then filled with a tungsten plug and etched to form a planar surface. Since both the plug and the interlayer are of substantially the same chemical composition, both the plug material and the interlayer can be etched in the same etchant. A contact metallization formed in accordance with the invention provides an improved contact structure having a low electrical resistance and reduced defects.

Shown in FIG. 1, in cross-section, is a portion of a semiconductor substrate 10 having already undergone several process steps in accordance with the invention. A first insulation layer 12 and a second insulation layer 14 overlie the surface of substrate 10. An opening 16 in first and second insulation layers 12 and 14 exposes a portion 18 of substrate surface 10. In the illustrative embodiment, first insulation layer 12 is preferably silicon dioxide deposited by chemical vapor deposition using a tetraethylorthosilane (TEOS) source gas. Second insulation layer 14 is preferably a doped silicate glass material such as boro-phosphorous-silicate-glass (BPSG) or, phosphorous-silicate-glass (PSG), and the like. The metal interlayer of the invention can be employed in a wide variety of contact metallization structures. Accordingly, the structure illustrated in FIG. 1 can represent a via opening exposing a variety of material surfaces to which a metal contact is to be made. For example, surface region 18 can be single crystal silicon, aluminum, an alloy of aluminum and silicon, an alloy of aluminum and copper, titanium silicide, and the like.

Opening 16 is preferably formed by anisotropically etching first and second insulation layers 12 and 14 to form smooth, vertical walls. A number of conventional anisotropic etching processes can be used to form opening 16. For example, the insulation layers can be anisotropically etched using fluorinated hydrocarbon etching gases, and the like. Once opening 16 is formed, oxide materials are removed from surface region 18. Oxides overlying surface region 18 can be removed by sputter cleaning, dry chemical etching, or wet chemical etching. The particular cleaning process will depend upon the material composition of surface region 18. For example, in the case of aluminum, aluminum oxide can be removed by argon sputter cleaning. Oxides can be removed from a silicon surface, where the oxide film is substantially silicon dioxide, by either dry chemical etching or wet chemical etching using fluorine based chemistry.

Figure 2:
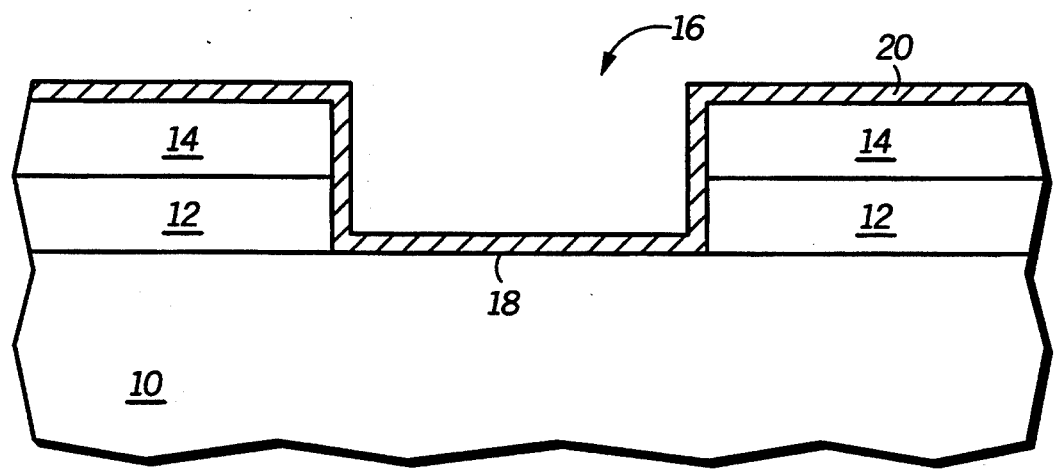

Immediately following the removal of oxides from surface region 18, a metal interlayer 20 is deposited to conformally overlie the exposed surface regions of first and second insulation layers 12 and 14, and surface region 18, as illustrated in FIG. 2. The deposition of metal interlayer 20 is carried out in an MOCVD deposition system using a metal organic precursor. The metal organic precursor can be one of a number of metal coordinated complexes having any number of coordinated organic ligands. In a preferred embodiment of the invention, tungsten is deposited from tungsten hexacarbonyl ($W(CO)_6$). The tungsten deposition is preferably carried out in an MOCVD reactor at a deposition temperature below 550° C., and at a pressure of about 200–600 millitorr. The relatively low temperature and pressure conditions of the MOCVD deposition enable the deposition of a conformal tungsten layer. Alternatively, tungsten can be deposited in an MOCVD reactor using $CpW(CO)_3CH_3$, or $Cp_2WH_2$ source gases, where Cp represents a cyclopentadienyl group. In addition, depending upon the particular source gas and substrate conditions, a deposition temperature of as high as 650° C. can be used.

In accordance with an alternate embodiment of the invention, tungsten nitride ($WN_2$) can be deposited in an MOCVD reactor using $(^tBuN)_2W(NH^tBu)_2$ source gas. The MOCVD deposition of tungsten nitride also provides a conformal interlayer, which can also be etched in fluorine based etching chemistry.

Both tungsten and tungsten nitride can be MOCVD deposited at a low deposition temperature to provide an interlayer having a low electrical resistivity. The low temperature deposition aspect of the present invention is especially important where electrical contact structures are being formed in devices having multiple layers of metal interconnects. Many of the metals and alloys commonly used in the fabrication of electrical interconnects have relatively low melting temperatures. By providing a technique for the formation of electrical contact structures at temperatures below 550° to 650° C., thermal damage to existing metal interconnect layers is avoided.

In addition, the low deposition temperature advantageously avoids the thermally induced diffusion of dopant species which may be present in substrate 10 during the formation of the interlayer. For example, a doped region is usually formed in a silicon substrate at a location where an electrical contact is to be made to the substrate. The doped region aids in the formation of an ohmic contact to the silicon substrate. High temperature deposition processes will diffuse the dopants in the substrate contact, thereby increasing the resistivity of the silicon at the contact surface. However, the MOCVD deposition conditions, used to deposit interlayer 20, do not thermally induce substantial lateral diffusion of dopants present in substrate 10, thus preserving the electrical integrity of the contact structure.

Figure 3:
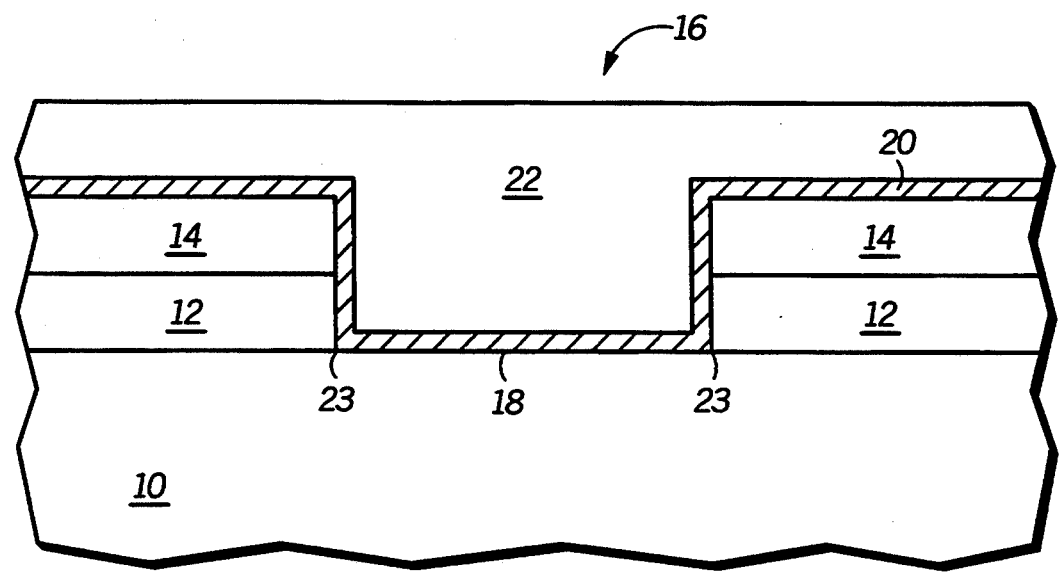

Following the deposition of interlayer 20, h refractory metal layer 22 is blanket deposited to overlie the surface of substrate 10, and to fill opening 16, as illustrated in FIG. 3. As a result of the conformal deposition of interlayer 20, the interlayer covers corner regions 23 of opening 16. By completely covering corner regions 23, a halogenated refractory metal gas can be used to form refractory metal layer 22, while avoiding the diffusion of halogen into corner regions 23. In the case of tungsten hexafluoride ($WF_6$). Fluorine can distort the geometry of opening 16 by diffusing into corner regions 23 and reacting with the material composing surface region 18. For example, fluorine will react with silicon to form silicon tetrafluoride, and will react with titanium to form titanium tetrafluoride. The unwanted reaction of fluorine with material components of substrate 10 can degrade the electrical performance of a contact structure by creating leakage paths for electrical current, and by creating voids at the bottom of the contact.

It should be apparent that the process of the present invention provides an interlayer which conformally overlies the surfaces of a high-aspect-ratio contact opening and prevents unwanted halogen reactions with materials underlying the interlayer. The use of halogenated source gases for refractory metal deposition is a well characterized and preferred method for the formation of contact structures such as via plugs. By preventing the unwanted diffusion of halogen, halogenated source gases can be used to form refractory metal plugs over interlayer 20, without damaging the substrate surface underlying the interlayer.

Figure 4:
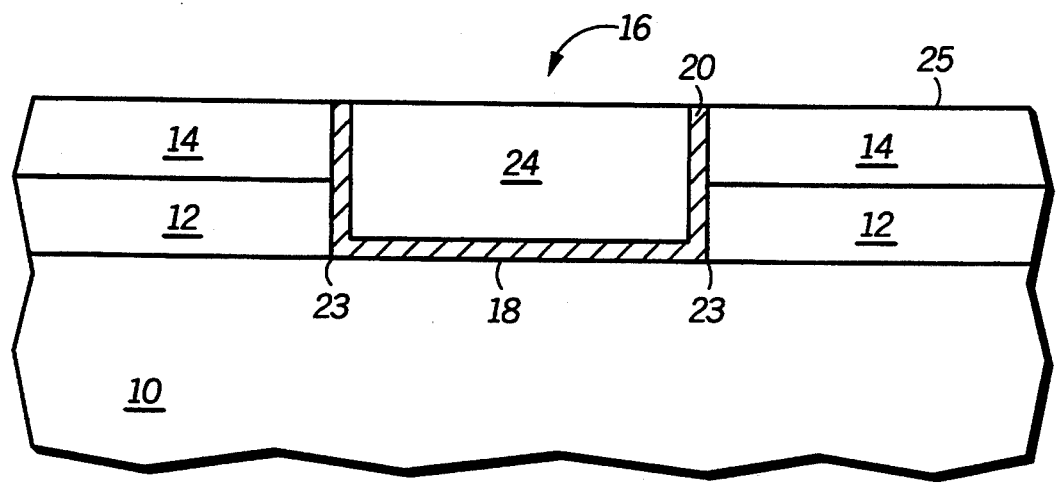

After refractory metal layer 22 is deposited, a refractory metal plug 24 is formed, as shown in FIG. 4, by etching back both refractory metal layer 22 and interlayer 20 and forming a planar surface 25. In accordance with the invention, both refractory metal layer 22 and interlayer 20 are etched using the same etchant chemistry. The ability to etch both the refractory metal layer and the underlying interlayer in the same etchant chemistry avoids the use of a complex etching process in which different etchant chemistry is used to etch layers having a substantially different material composition. For example, where a tungsten plug is formed over a titanium nitride interlayer, fluorine based chemistry must be used to etch the tungsten and chlorine based chemistry must be used to etch the titanium nitride. The use of different etchant chemistries can result in particle contamination of the substrate being etched. When etchant chemistry is changed, particles can be generated from the walls of the etching chamber, which then fall to the substrate and can become incorporated in surface layers of the substrate. Alternatively, another planarization method, such as chemical-mechanical-polishing can be used to form surface 25. Thus, the process of the present invention provides a refractory metal plug and a smooth, planar surface in which particle contamination is substantially reduced.

Figure 5:
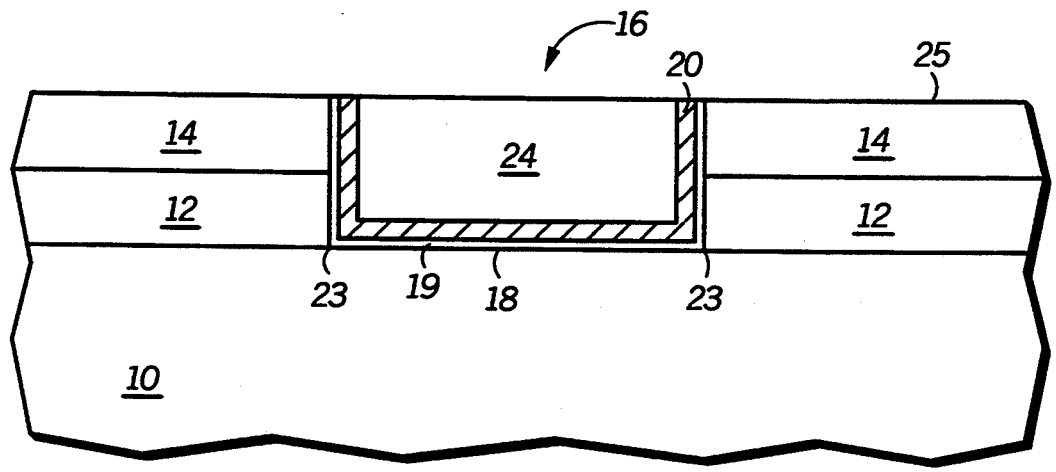
FIG. 5, illustrates, in cross-section, an alternative embodiment of the invention.

An alternative embodiment of the invention is illustrated, in cross-section, in FIG. 5. In the alternative embodiment, a layer of reactive metal 19 is deposited onto substrate 10 prior to depositing interlayer 20. In the case where surface region 18 is a silicon or aluminum material, layer 19 functions to insure low electrical resistance by reacting with the surface material and reducing oxides present on surface region 18. To better insure that a low resistivity contact is formed, surface region 18 can be cleaned prior to depositing reactive metal layer 19, as described in the foregoing embodiment.

Preferably, reactive metal layer 19 is a thin layer of titanium or tantalum is sputter deposited to overlie second insulation layer 14, surface region 18, and the exposed surface of first insulation layer 12. Then, interlayer 20 is deposited to overlie reactive metal layer 19, and refractory metal layer 22 is deposited to overlie interlayer 20. Finally, refractory metal plug 24 is formed by either sequentially etching or polishing layers 22, 20, and 19 to form planar surface 25.

Although the process of the present invention is illustrated in the context of a via plug structure, those skilled in the art will recognize that the process of the present invention can be used to form a variety of metallization structures. For example, conventional contact structures can be formed in which an MOCVD deposited interlayer is included as one of a multiple layered metal contact structure.

Figure 6:
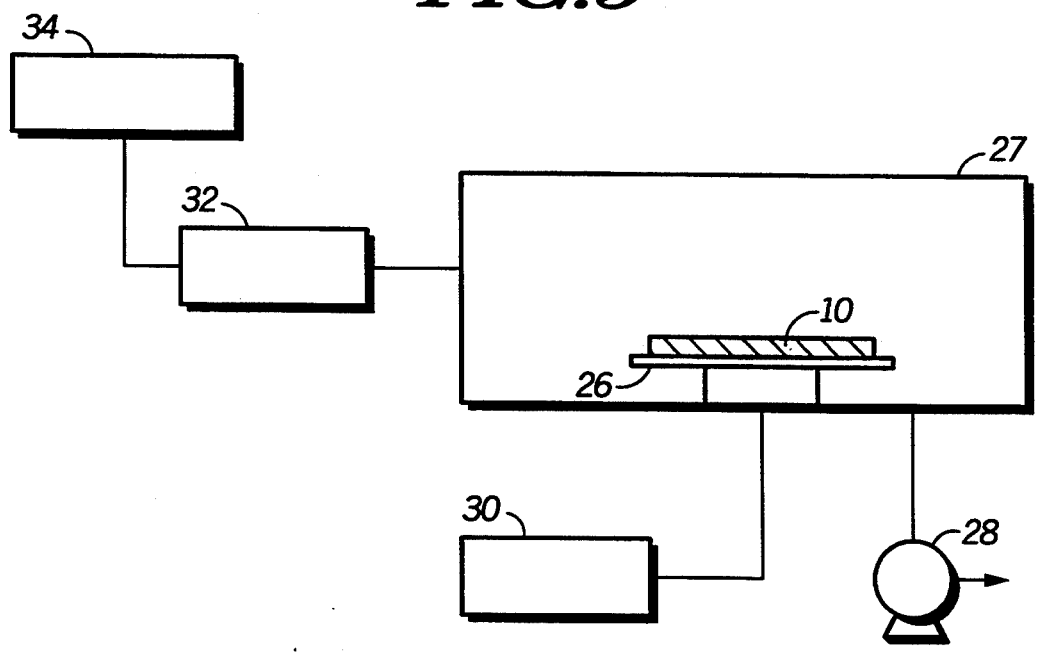
FIG. 6 is a schematic illustration of a representative MOCVD system useful in practicing the invention.

FIG. 6 illustrates a schematic diagram of an MOCVD deposition system, which can be used in the practice of the present invention. Substrate 10 is placed on a resistively heated susceptor 26, which resides within a deposition chamber 27. The pressure within deposition chamber 27 is controlled by a vacuum pumping system 28. The temperature of susceptor 26 is controlled by a temperature controller system 30. The metal precursor used to form interlayer 20 on substrate 10 is contained within a source containment vessel 32. Carrier gas is supplied from a gas delivery system 34 and is transported through source containment vessel 32 and into deposition chamber 27. The carrier gas can be one of a number of inert gaseous species such as helium, nitrogen, hydrogen, and the like. The metal precursor can be heated within source containment vessel 32 to generate vapor above a solid or liquid source. The vapor is then entrained by the carrier gas and transported to deposition chamber 27.

In one embodiment of the invention, solid tungsten hexacarbonyl is placed within containment vessel 32 and hydrogen gas is introduced at a rate of about 100 sccm. The tungsten hexafluoride is contained within a heated ampule within source containment 32 and maintained at a temperature of about 65° C. The MOCVD deposition process is used to deposit a tungsten interlayer, preferably having a thickness of about 1,000 to 6,000 angstroms and a resistivity of about 10 $\mu\Omega$-cm. Following the formation of interlayer 20 in deposition chamber 27, substrate 10 can be removed and placed in a conventional CVD deposition system in which a refractory metal layer is deposited to overlie interlayer 20. Alternatively, a refractory metal layer can be deposited in deposition chamber 27 using a halogenated refractory metal gas deliver system (not shown).

Thus it is apparent that there has been provided, in accordance with the invention, a process for fabricating a metallization structure in a semiconductor device, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the metal interlayer can be used to adhere metal interconnect leads to the surface of a substrate. It is therefore intended to include within the invention all such variations and modifications as fall within the scope of the appended claims and equivalents thereof.

We claim:

1. A process for fabricating a semiconductor device comprising the steps of:
    providing a semiconductor substrate having a surface;
    providing a metal organic precursor having as one component tungsten;
    depositing an interlayer onto the surface from the metal organic precursor; and
    depositing a layer of tungsten onto the interlayer.

2. The process of claim 1, wherein the step of depositing an interlayer comprises depositing a material selected from the group consisting of tungsten and tungsten nitride.

3. The process of claim 1, wherein the step of providing a metal organic precursor comprises providing a compound selected from the group consisting of $W(CO)_6$, $CpW(CO)_3CH_3$ and $Cp_2WH_2$, wherein Cp represents a cyclopentadienyl group, and $(^tBuN)_2W(NH^tBu)_2$, wherein $^tBu$ represents a tertiary-butyl aliphatic group.

4. The process of claim 1, wherein the step of depositing an interlayer comprises depositing tungsten from $W(CO)_6$ entrained in hydrogen vapor.

5. A process for fabricating a semiconductor device comprising the steps of:
   providing a substrate having a dielectric layer overlying a surface of the substrate;
   forming an opening in the dielectric layer exposing a portion of the surface;
   depositing an interlayer from a metal-organic precursor into the opening to overlie the dielectric layer and the exposed silicon surface, wherein the interlayer is selected from the group consisting of tungsten and tungsten nitride; and
   depositing a layer of tungsten overlying the interlayer and filling the opening.

6. The process of claim 5, wherein the step of depositing an interlayer comprises depositing tungsten from a tungsten carbonyl compound entrained in a carrier gas.

7. The process of claim 5 further comprising the step of removing oxides from the exposed surface prior to depositing the interlayer.

8. The process of claim 5, wherein the step of providing a substrate surface comprises providing a silicon surface.

9. The process of claim 5, wherein the step of providing a substrate surface comprises providing a semiconductor substrate having a layer selected from the group consisting of silicon, aluminum, aluminum alloyed with copper, aluminum alloyed with silicon, titanium silicide, and titanium nitride overlying the semiconductor substrate.

10. The process of claim 5 further comprising the step of etching the tungsten layer and the metal interlayer in a fluorine compound to form a tungsten plug in the opening.

11. The process of claim 5 further comprising the step of depositing a reactive metal layer on the exposed surface portion prior to depositing the interlayer.

12. A process for fabricating a semiconductor device comprising the steps of:
    providing a metal-organic chemical vapor deposition apparatus;
    placing a substrate onto a susceptor within the apparatus;
    flowing a metal-organic precursor vapor to the susceptor;
    depositing a metal interlayer selected from the group consisting of tungsten and tungsten nitride onto the substrate; and
    depositing a layer of tungsten to overlie the metal interlayer, wherein the tungsten is deposited in a chemical vapor deposition system using $WF_6$ source gas.

13. The process of claim 12, wherein the step of flowing a metal organic precursor comprises flowing a compound selected from the group consisting of $W(CO)_6$, $CpW(CO)_3CH_3$ and $Cp_2WH_2$, wherein Cp represents a cyclopentadienyl group, and $(^tBuN)_2W(NH^tBu)_2$, wherein tBu represents a tertiary-butyl aliphatic group.

14. The process of claim 12, wherein the step of depositing a metal interlayer is carried out at a temperature below 550 degrees C.

15. The process of claim 12 further comprising the step of removing oxides from the exposed surface prior to depositing the interlayer.

* * * * *